(12) United States Patent
Liu et al.

(10) Patent No.: US 11,527,554 B2
(45) Date of Patent: Dec. 13, 2022

(54) ARRAY SUBSTRATE, MANUFACTURING METHOD THEREOF, AND DISPLAY DEVICE

(71) Applicant: Beijing BOE Technology Development Co., Ltd., Beijing (CN)

(72) Inventors: Libin Liu, Beijing (CN); Qian Yang, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 179 days.

(21) Appl. No.: 16/619,227

(22) PCT Filed: Mar. 29, 2019

(86) PCT No.: PCT/CN2019/080600
§ 371 (c)(1),
(2) Date: Dec. 4, 2019

(87) PCT Pub. No.: WO2020/007077
PCT Pub. Date: Jan. 9, 2020

(65) Prior Publication Data
US 2021/0343752 A1 Nov. 4, 2021

(30) Foreign Application Priority Data
Jul. 2, 2018 (CN) .................. 201810710254.0

(51) Int. Cl.
*H01L 27/12* (2006.01)
*H01L 29/66* (2006.01)
*H01L 29/786* (2006.01)

(52) U.S. Cl.
CPC ........ *H01L 27/1222* (2013.01); *H01L 27/127* (2013.01); *H01L 29/6675* (2013.01); *H01L 29/78672* (2013.01); *H01L 29/78696* (2013.01)

(58) Field of Classification Search
CPC ............ H01L 27/1222; H01L 27/127; H01L 29/6675; H01L 29/78672; H01L 29/78696;
(Continued)

(56) References Cited

U.S. PATENT DOCUMENTS

| 7,611,932 B2 | 11/2009 | Yin et al. |
| 2003/0141505 A1 | 7/2003 | Isobe et al. |

(Continued)

FOREIGN PATENT DOCUMENTS

| CN | 1753156 A | 3/2006 |
| CN | 101924070 A | 12/2010 |

(Continued)

OTHER PUBLICATIONS

First Chinese Office Action from Chinese Patent Application No. 20181070254.0 dated Dec. 3, 2020.

*Primary Examiner* — Mohammed R Alam
(74) *Attorney, Agent, or Firm* — Dilworth & Barrese, LLP.; Michael J. Musella, Esq.

(57) ABSTRACT

An array substrate, a manufacturing method thereof, and a display device are provided. The array substrate includes: a base substrate; a first thin film transistor located on the base substrate and including a first active layer; and a second thin film transistor located on the base substrate and including a second active layer; a matrix material of the first active layer is the same as that of the second active layer, and the first active layer and the second active layer satisfy at least one of the following conditions: a carrier mobility of the first active layer is greater than that of the second active layer, and a carrier concentration of the first active layer is greater than that of the second active layer. The array substrate is (Continued)

employed to compensate a difference in threshold voltage caused by a difference in channel width-to-length ratio of different thin film transistors.

18 Claims, 3 Drawing Sheets

(58) Field of Classification Search
CPC ............ H01L 27/1218; H01L 27/1237; H01L 27/1229
See application file for complete search history.

(56) References Cited

U.S. PATENT DOCUMENTS

| | | | |
|---|---|---|---|
| 2014/0138644 A1* | 5/2014 | Park | H01L 27/3262 438/34 |
| 2017/0053950 A1* | 2/2017 | Koezuka | H01L 29/78603 |
| 2018/0076097 A1 | 3/2018 | Ching et al. | |

FOREIGN PATENT DOCUMENTS

| | | |
|---|---|---|
| CN | 104157700 A | 11/2014 |
| CN | 105870059 A | 8/2016 |
| CN | 106024811 A | 10/2016 |
| CN | 107316897 A | 11/2017 |
| CN | 107516661 A | 12/2017 |
| WO | 2014153941 A1 | 10/2014 |

\* cited by examiner

ARRAY SUBSTRATE, MANUFACTURING METHOD THEREOF, AND DISPLAY DEVICE

CROSS-REFERENCE TO RELATED APPLICATIONS

The present application claims priority to the Chinese patent application No. 201810710254.0, filed on Jul. 2, 2018, the entire disclosure of which is incorporated herein by reference as part of the present application.

TECHNICAL FIELD

At least one embodiment of the present disclosure relates to an array substrate, a manufacturing method thereof, and a display device.

BACKGROUND

Low Temperature Poly-Silicon (LTPS) has higher electron mobility and higher stability than amorphous silicon, and the electron mobility of low temperature polysilicon can reach tens or even hundreds of times as much as that of amorphous silicon. Therefore, the technology in which a low temperature polysilicon material is used to form a thin film transistor has been rapidly developed.

SUMMARY

At least one embodiment of the present disclosure provides an array substrate, a manufacturing method thereof, and a display device. Regarding the array substrate provided by the embodiments of the present disclosure, a difference in threshold voltage that is caused by a difference in channel width-to-length ratio of different thin film transistors is compensated by adjusting a carrier mobility or a carrier concentration of thin film transistors in different regions, thereby solving a circuit failure problem caused by a larger difference in threshold voltage of thin film transistors in different regions.

At least one embodiment of the present disclosure provides an array substrate, which includes: a base substrate; a first thin film transistor located on the base substrate and including a first active layer; and a second thin film transistor located on the base substrate and including a second active layer; a matrix material of the first active layer is the same as a matrix material of the second active layer, and the first active layer and the second active layer satisfy at least one of the following conditions: a carrier mobility of the first active layer is greater than that of the second active layer, and a carrier concentration of the first active layer is greater than that of the second active layer.

In the array substrate provided by one or more embodiments of the present disclosure, a channel width-to-length ratio of the first thin film transistor is less than a channel width-to-length ratio of the second thin film transistor.

In the array substrate provided by one or more embodiments of the present disclosure, a distance between the first active layer and the base substrate is greater than a distance between the second active layer and the base substrate.

In the array substrate provided by one or more embodiments of the present disclosure, the array substrate further includes an insulation layer located between the base substrate and the first active layer and including a groove running through at least a part of the insulation layer; the second active layer is located within the groove, and the first active layer is located on a surface of the insulation layer excluding the groove, and the surface is at a side of the insulation layer away from the base substrate.

In the array substrate provided by one or more embodiments of the present disclosure, the matrix material of the first active layer and the matrix material of the second active layer include polysilicon.

In the array substrate provided by one or more embodiments of the present disclosure, the array substrate includes a display region and a peripheral region surrounding the display region, the first thin film transistor is located in the display region, and the second thin film transistor is located in the peripheral region.

At least one embodiment of the present disclosure further provides a display device including any one of the array substrates as described above.

At least one embodiment of the present disclosure further provides a manufacturing method of an array substrate, which includes: forming a first thin film transistor and a second thin film transistor in a first region and a second region of a base substrate, respectively; forming the first thin film transistor includes forming a first active layer, and forming the second thin film transistor includes forming a second active layer; forming the first active layer and forming the second active layer include: forming a semiconductor layer in the first region and the second region synchronously; a portion of the semiconductor layer located in the first region is used to form the first active layer, and a portion of the semiconductor layer located in the second region is used to form the second active layer; and the method includes performing a treatment process on at least one of the portion of the semiconductor layer located in the first region and the portion of the semiconductor layer located in the second region so that the first active layer and the second active layer satisfy at least one of the following conditions: a carrier mobility of the first active layer is greater than that of the second active layer, and a carrier concentration of the first active layer is greater than that of the second active layer.

In the method provided by one or more embodiments of the present disclosure, a channel width-to-length ratio of the first thin film transistor is less than a channel width-to-length ratio of the second thin film transistor.

In the method provided by one or more embodiments of the present disclosure, the first active layer is formed at a side of the second active layer away from the base substrate.

In the method provided by one or more embodiments of the present disclosure, a distance between the first active layer and the base substrate is greater than a distance between the second active layer and the base substrate.

In the method provided by one or more embodiments of the present disclosure, before forming the semiconductor layer, the method further includes forming an insulation layer on the base substrate; and patterning the insulation layer so as to form a groove running through at least a part of the insulation layer in the second region; forming the semiconductor layer includes forming the semiconductor layer on the insulation layer after being patterned; performing the treatment process on the semiconductor layer includes performing a chemical mechanical polishing process on the portion of the semiconductor layer located in the first region to increase the carrier mobility of the first active layer, so as to decrease a difference in threshold voltage between the first thin film transistor and the second thin film transistor.

In the method provided by one or more embodiments of the present disclosure, forming the first active layer and the second active layer includes: patterning the semiconductor layer to form the first active layer located in the first region and the second active layer located within the groove, before or after performing the chemical mechanical polishing process on the portion of the semiconductor layer located in the first region.

In the method provided by one or more embodiments of the present disclosure, performing the treatment process on at least one of the portion of the semiconductor layer located in the first region and the portion of the semiconductor layer located in the second region includes at least one of the following processes: performing a doping process on the portion of the semiconductor layer located in the first region to increase the carrier concentration of the first active layer; and performing a doping process on the portion of the semiconductor layer located in the second region to decrease the carrier concentration of the second active layer.

In the method provided by one or more embodiments of the present disclosure, a matrix material of the semiconductor layer includes polysilicon.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

Figure 1A:
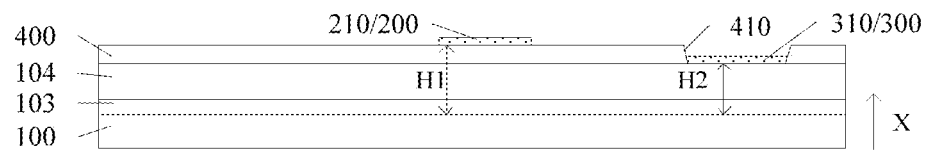
FIG. 1A is a schematic view illustrating a partial structure of an array substrate provided by an embodiment of the present disclosure.

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship.

In the study, inventor(s) of this application found that a threshold voltage of a thin film transistor would decrease with an increase of a channel width-to-length ratio of the thin film transistor. In general, in an array substrate of a Gate Driver On Array (GOA) type, a channel width-to-length ratio of a thin film transistor located in a gate driver region is relatively large, and may be tens of times as much as a channel width-to-length ratio of a thin film transistor located in a display region (active area, AA area), resulting in a larger difference in threshold voltage of thin film transistors located in different regions. The larger difference in threshold voltage would lead to the problem that some of the circuits on the array substrate cannot work properly, that is, circuit failure.

An embodiment of the present disclosure provides an array substrate, which includes a base substrate, a first thin film transistor (TFT) and a second TFT, the first TFT is located on the base substrate and includes a first active layer; and the second TFT is located on the base substrate and includes a second active layer. A matrix material of the first active layer is the same as that of the second active layer, and the first active layer and the second active layer satisfy at least one of the following conditions: a carrier mobility of the first active layer is greater than that of the second active layer, and a carrier concentration of the first active layer is greater than that of the second active layer.

Embodiments of the present disclosure provide an array substrate, a manufacturing method thereof, and a display device. The manufacturing method of the array substrate includes forming a first TFT and a second TFT in a first region and a second region of a base substrate, respectively. Forming the first TFT includes forming a first active layer, and forming the second TFT includes forming a second active layer. Forming the first active layer and the second active layer includes synchronously forming a semiconductor layer in the first region and the second region, a portion of the semiconductor layer located in the first region is used to form the first active layer, and a portion of the semiconductor layer located in the second region is used to form the second active layer; at least one of the portion of the semiconductor layer located in the first region and the portion of the semiconductor layer located in the second region is subjected to a treatment process so that the first active layer and the second active layer satisfy at least one of the following conditions: a carrier mobility of the first active layer is greater than that of the second active layer, and a carrier concentration of the first active layer is greater than that of the second active layer.

In the array substrate and the manufacturing method of the array substrate provided by embodiments of the present disclosure, a difference in threshold voltage caused by a difference in channel width-to-length ratio of different TFTs in different regions can be compensated by adjusting a carrier mobility or a carrier concentration of TFTs in different regions, thus solving a circuit failure problem caused by a larger difference in threshold voltage of TFTs in different regions.

Hereinafter, an array substrate and a manufacturing method thereof, and a display device provided by embodiments of the present disclosure will be described in conjunction with attached drawings.

FIG. 1A is a schematic view illustrating a partial structure of an array substrate provided by an embodiment of the present disclosure. As illustrated in FIG. 1A, the array substrate includes a base substrate 100, a first TFT 200 and a second TFT 300 that are located on the base substrate 100. The first TFT 200 includes a first active layer 210, the second TFT 300 includes a second active layer 310, a channel width-to-length ratio of the first TFT 200 is less than that of the second TFT 300, a matrix material of the first active layer 210 is the same as that of the second active layer 310, and a carrier mobility of the first active layer 210 is greater than that of the second active layer 310. A channel width-to-length ratio refers to a ratio of a width of a channel to a length of the channel.

It is to be explained that, "a matrix material of the first active layer being the same as that of the second active layer" herein refers to that the first active layer and the second active layer are formed from the same semiconductor layer. Before a semiconductor layer is patterned or subjected to other treatment process to form the first active layer and the second active layer, a matrix material of the first active layer and a matrix material of the second active layer are just a matrix material of the semiconductor layer. For example, if a material of the first active layer and a material of the second active layer are doped, then a matrix material of the first active layer and a matrix material of the second active layer are the same before a doping process, or if a grain boundary state is changed for a material of the first active layer and a material of the second active layer, then a matrix material of the first active layer and a matrix material of the second active layer are the same before a change in grain boundary state. For example, a matrix material of the first active layer and a matrix material of the second active layer may be polysilicon, and even after they are doped or the grain boundary state is changed, a matrix material of the first active layer and a matrix material of the second active layer are still polysilicon.

In addition, FIG. 1A illustrates only the first active layer 210 included by the first TFT 200, and the second active layer 310 included by the second TFT 300, and does not illustrate other structures in the first TFT 200 and the second TFT 300.

In the case where only the effect of a channel width-to-length ratio on a TFT device is considered, a threshold voltage will be decreased as a channel width-to-length ratio of the TFT is increased, and a leakage current will be increased as a channel width-to-length ratio of the TFT is increased. In the case where the voltage between source and drain electrodes of the TFT falls within a certain range, an on-state current also increases with an increase of a channel width-to-length ratio. A channel width-to-length ratio of the first TFT in the present embodiment is less than that of the second TFT, and therefore, a threshold voltage of the first TFT is greater than that of the second TFT according to the relationship between the channel width-to-length ratio and the threshold voltage.

In a conventional array substrate, owing to the fact that a channel width-to-length ratio of TFTs in different regions has a relatively large difference, a difference in threshold voltage of TFTs in different regions is larger, and it is easy to lead to a circuit cannot work properly. In some embodiments, by regulating a carrier mobility of the first active layer in the first TFT, a carrier mobility in the first TFT is made to be greater than a carrier mobility in the second TFT, thereby reducing a threshold voltage of the first TFT. Thus, a difference in threshold voltage between the first TFT and the second TFT that is resultant from a difference in channel width-to-length ratio is reduced, and a problem of circuit failure, which is caused by the fact that threshold voltage of TFTs in partial circuit region is too low or overhigh, is solved.

For example, as illustrated in FIG. 1A, in some embodiments, a distance H1 between the first active layer 210 and the base substrate 100 is greater than a distance H2 between the second active layer 310 and the base substrate 100, that is, the first active layer 210 is located at a side of the second active layer 310 away from the base substrate 100. Thus, the carrier mobility of the first active layer 210 can be increased by performing a treatment process on only the first active layer 210.

For example, as illustrated in FIG. 1A, the array substrate further includes a buffer layer 400 that is located on the base substrate 100 and includes a groove 410, and the second active layer 310 is located within the groove 410. The first active layer 210 is located on a surface of the buffer layer 400 excluding the groove, and the surface of the buffer layer 400 is at a side of the buffer layer 400 away from the base substrate 100, and thus, a distance H1 between the first active layer 210 and the base substrate 100 is greater than a distance H2 between the second active layer 310 and the base substrate 100. Therefore, the carrier mobility of the first active layer 210 can be increased by performing a treatment process on only the first active layer 210. For example, as illustrated in FIG. 1A, the second active layer 310 is located within the groove 410 completely.

For example, as illustrated in FIG. 1A, a film layer, such as an organic film layer 104, located at a side of the buffer layer 400 facing the base substrate 100, can be exposed by the groove 410 of the buffer layer 400, and in this case, the second active layer 310 is located on a surface of the organic film layer 104, without limited thereto. For example, the groove of the buffer layer may not run through the buffer layer, either, and in this case, the second active layer is also located on the buffer layer. For another example, the groove of the buffer layer may also reach into a non-conductive film layer at a side of the buffer layer facing the base substrate, that is, a depth of the groove is greater than a thickness of the buffer layer, and the groove runs through the buffer layer and at least runs through a part of the non-conductive film layer at a side of the buffer layer facing the base substrate.

For example, as illustrated in FIG. 1A, the array substrate further includes a barrier layer 103 located between the base substrate 100 and the organic film layer 104.

For example, both the base substrate 100 and the organic film layer 104 are flexible film layers, and a material of the flexible film layer includes polyimide (PI). A material of the barrier layer 103 may be silicon oxide, so that the barrier layer 103 not only can block an influence of impurity ions in base glass located at a side of the base substrate 100 away from the barrier layer 103 on other film layers in the array substrate during manufacturing array substrate, but also can meet a stress matching requirement between the base substrate 100 and the organic film layer 104. Besides, the barrier layer 103 can also play a waterproof role.

For example, a matrix material of the first active layer 210 and a matrix material of the second active layer 310 include polysilicon, without limited thereto.

For example, the first active layer 210 and the second active layer 310 are formed from the same semiconductor layer on a base substrate 100, and the semiconductor layer has the same material everywhere. The first active layer 210 and the second active layer 310 are formed by performing a one-step patterning process on the semiconductor layer. For example, only the first active layer 210 is subjected to a Chemical Mechanical Polishing (CMP) process so as to increase a carrier mobility of the first active layer 210, while the CMP process is not performed on the second active layer 310.

For example, a chemical mechanical polishing process is to smooth a silicon wafer or a base substrate of other material that is in a process by using chemical corrosion and mechanical force. Generally, a chemical mechanical polishing process is performed only on a material in a protruded place, and because a position of the first active layer is protruded in a direction indicated by an arrow X relative to a position of the second active layer, that is, the first active layer is farther away from the base substrate than the second active layer, the chemical mechanical polishing would not performed on the second active layer, and a carrier mobility in the second active layer remains unchanged.

For example, by performing a chemical mechanical polishing process on the first active layer such as a first active layer made of a polysilicon material, grain boundaries of the first active layer (e.g. polysilicon) may be reduced to a certain extent, thereby increasing a mobility of carriers of the first active layer such as the first active layer made of polysilicon, and reducing a threshold voltage of the first TFT.

Figure 1B:
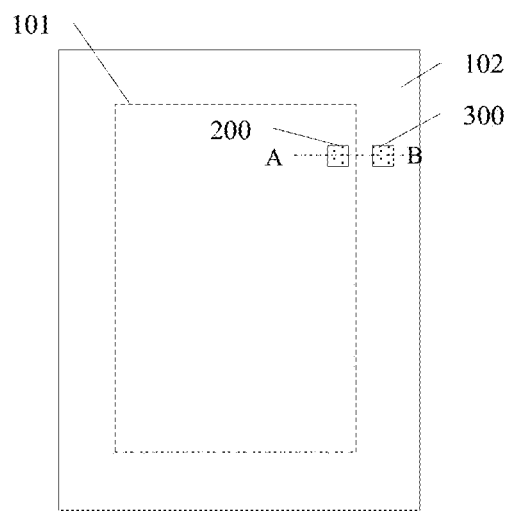
FIG. 1B is a schematic view illustrating a partial structure of an array substrate provided by an embodiment of the present disclosure.

For example, FIG. 1B is a schematic view illustrating a partial structure of an array substrate provided by an embodiment of the present disclosure, and FIG. 1A is a cross-sectional view taken along line A-B in FIG. 1B. As illustrated in FIG. 1B, the array substrate includes a display region 101 and a peripheral region 102 surrounding the display region 101, the first TFT 200 is located in the display region 101, and the second TFT 300 is located in the peripheral region 102. FIG. 1B only schematically illustrates one first TFT 200 in the display region 101, and one second TFT 300 in the peripheral region 102, and the number of the first TFTs 200 and the number of the second TFTs 300 are determined according to the actual process requirements.

A channel width-to-length ratio of a second TFT located in the peripheral region is generally about tens of times as much as a channel width-to-length ratio of a first TFT located in the display region. In some embodiments of the present disclosure, by regulating a carrier mobility of a first active layer of a first TFT, a threshold voltage of the first TFT can be decreased so as to reduce a difference in threshold voltage between the first TFT and the second TFT caused by a difference in channel width-to-length ratio between the first TFT and the second TFT. As a result, a difference in threshold voltage between TFTs located in the display region and the peripheral region is relatively small, so as to effectively solve a circuit failure problem caused by the fact that a threshold voltage in a partial circuit region is too low or overhigh.

The manner in which a carrier mobility of the first active layer of the first TFT is regulated provided by an embodiment of the present disclosure is applicable to TFTs in any regions that need to be regulated to change the threshold voltage. As long as a threshold voltage of the first TFT can be reduced by regulating a carrier mobility of the first active layer of the first TFT so as to reduce the difference in threshold voltage between the first TFT and the second TFT, no matter the second TFT is located in a display region or a peripheral region, the circuit can work properly owing to the fact that the difference in threshold voltage between the first TFT and the second TFT is decreased.

Besides the first active layer 210 is processed by way of CMP to increase a carrier mobility of the first active layer, and then a difference in threshold voltage between TFTs located in different regions is decreased, the difference in threshold voltage between TFTs located in different regions can also be decreased by other way.

Figure 1C:
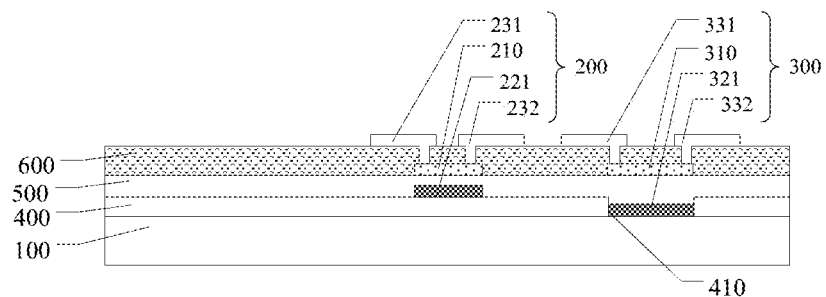
FIG. 1C is a schematic view illustrating a structure of an array substrate provided by an embodiment of the present disclosure.

FIG. 1C is a schematic view illustrating a structure of an array substrate provided by an embodiment of the present disclosure. As illustrated in FIG. 1C, the array substrate includes a base substrate 100, a buffer layer 400, a first TFT 200 and a second TFT 300. The first TFT 200 includes a first gate electrode 221, a first active layer 210, a first source electrode 231 and a first drain electrode 232. The second TFT 300 includes a second gate electrode 321, a second active layer 310, a second source electrode 331 and a second drain electrode 332. The buffer layer 400 includes a groove 410 that runs through the buffer layer 400. The first active layer 210 is located on an upper surface of the buffer layer, and the second active layer 310 is located within the groove 410. The first active layer 210 is treated by a CMP process, the second active layer 310 is not treated by the CMP process, so as to reduce a threshold voltage of the first TFT, and in turn, a difference in threshold voltage between the first TFT and the second TFT that is caused by a difference in channel width-to-length ratio is decreased. A portion of the first active layer 210 between the first source electrode 231 and the first drain electrode 232 is a first channel, a portion of the second active layer 310 between the second source electrode 331 and the second drain electrode 332 is a second channel, and a width-to-length ratio of the first channel is less than that of the second channel. FIG. 1C also illustrates a gate insulation layer 500 and an interlayer insulation layer 600. The buffer layer 400, the gate insulation layer 500 and the interlayer insulation layer 600 are all made of insulation materials. The first gate electrode 221, the first source electrode 231, the first drain electrode 232, the second gate electrode 321, the second source electrode 331 and the second drain electrode 332 are all made of metallic materials. Constructions of the first TFT 200 and the second TFT 300 have been illustrated with reference to FIG. 1C in an embodiment of the present disclosure, by way of example, without limited to those illustrated in FIG. 1C.

Figure 2A:
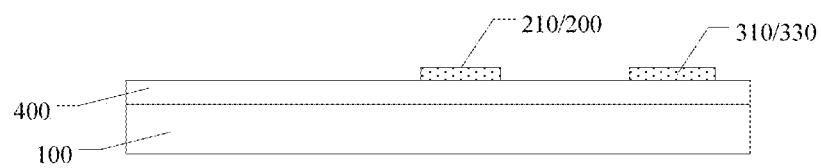
FIG. 2A is a schematic view illustrating a partial structure of an array substrate provided by an embodiment of the present disclosure.

FIG. 2A is a schematic view illustrating a partial structure of an array substrate provided by an embodiment of the present disclosure. As illustrated in FIG. 2A, for a first active layer 210 of a first TFT 200, a carrier concentration within the first active layer 210 is increased by a doping process, and/or, for a second active layer 310 of a second TFT 300, a carrier concentration within the second active layer 310 is decreased by a doping process, so as to reduce a difference in threshold voltage between the first TFT 200 and the second TFT 300.

FIG. 2A illustrates only the first active layer 210 included by the first TFT 200, and the second active layer 310 included by the second TFT 300, and does not illustrate other structures in the first TFT 200 and the second TFT 300.

For example, both the first active layer 210 and the second active layer 310 are located on the buffer layer 400. In the present embodiment, a treatment process different from that of the array substrate illustrated in FIG. 1A is employed, and so, the first active layer 210 and the second active layer 310 can be arranged at the same distance from the base substrate 100 without the need of providing a groove in the buffer layer 400.

In some embodiments of the present disclosure, a carrier concentration of the first active layer 210 and/or that of the second active layer 310 may be changed by a doping process, and thus a threshold voltage of the first TFT is decreased and/or a threshold voltage of the second TFT is increased so as to reduce a difference in threshold voltage between the first TFT and the second TFT caused by a difference in channel width-to-length ratio between the first TFT and the second TFT.

For example, the method includes shielding the second active layer 310 with a mask to keep a threshold voltage of the second TFT 300 unchanged when performing a lightly doping process on the first active layer 210 to increase a carrier concentration within the first active layer 210, thereby reducing a threshold voltage of the first TFT 200, and reducing a difference in threshold voltage between the first TFT 200 and the second TFT 300 caused by a larger difference in channel width-to-length ratio between the two TFTs.

For example, in the case where the first TFT 200 is a P-type TFT, a concentration of holes may be increased by performing a P-type doping process on the first active layer 210, so as to reduce a threshold voltage of the first TFT 200.

For example, in the case where the first TFT 200 is an N-type TFT, a concentration of electrons may be increased by performing a N-type doping process on the first active layer 21, so as to reduce a threshold voltage of the first TFT 200.

For example, the method includes shielding the first active layer 210 with a mask to keep a threshold voltage of the first TFT 200 unchanged when performing a lightly doping process on the second active layer 310 (for example, the second TFT is a P-type TFT) so as to reduce a hole concentration, thereby increasing a threshold voltage of the second TFT 300, and reducing a difference in threshold voltage between the first TFT 200 and the second TFT 300 caused by a larger difference in channel width-to-length ratio, without limited thereto in the embodiments of the present disclosure. In the case where the second TFT 300 is an N-type TFT, a P-type lightly doping process may be performed on the second active layer 310 to reduce an electron concentration, thereby increasing a threshold voltage of the second TFT 300.

For example, it is possible to perform a doping process on both the first active layer and the second active layer, and thus, not only a threshold voltage of the first TFT is reduced, but also a threshold voltage of the second TFT is raised. Consequently, a difference in threshold voltage between the first TFT and the second TFT caused by a larger difference in channel width-to-length ratio is reduced. For another example, it is possible that not only a carrier mobility of the first active layer is increased, but also the first active layer and/or the second active layer are/is doped to adjust a carrier concentration, thus reducing a difference in threshold voltage between the first TFT and the second TFT caused by a larger difference in channel width-to-length ratio.

Another embodiment of the present disclosure provides a manufacturing method of an array substrate. The manufacturing method of the array substrate provided by the present embodiment includes forming a first TFT and a second TFT in a first region and a second region of a base substrate, respectively, forming the first TFT includes forming a first active layer, and forming the second TFT including forming a second active layer.

Figure 2B:
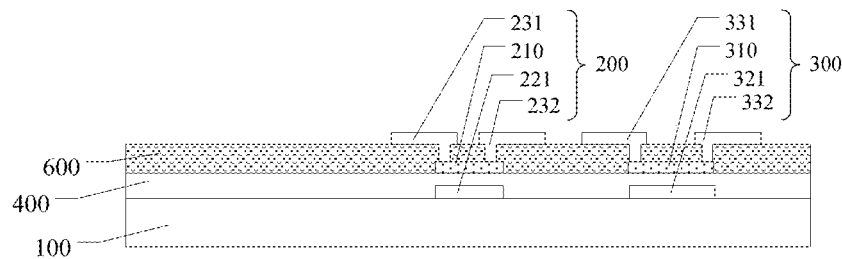
FIG. 2B is a schematic view illustrating an array substrate provided by another embodiment of the present disclosure.

FIG. 2B is a schematic view illustrating an array substrate provided by another embodiment of the present disclosure. As illustrated in FIG. 2B, the array substrate includes a base substrate 100, a buffer layer 400, a first TFT 200 and a second TFT 300. The first TFT 200 includes a first gate electrode 221, a first active layer 210, a first source electrode 231 and a first drain electrode 232. The second TFT 300 includes a second gate electrode 321, a second active layer 310, a second source electrode 331 and a second drain electrode 332. A portion of the first active layer 210 between the first source electrode 231 and the first drain electrode 232 is a first channel, a portion of the second active layer 310 between the second source electrode 331 and the second drain electrode 332 is a second channel, and a width-to-length ratio of the first channel is less than a width-to-length ratio of the second channel. FIG. 2B also illustrates an interlayer insulation layer 600. Both the buffer layer 400 and the interlayer insulation layer 600 are made of insulation materials. The first gate electrode 221, the first source electrode 231, the first drain electrode 232, the second gate electrode 321, the second source electrode 331 and the second drain electrode 332 are all made of metallic materials. The first active layer 210 and the second active layer 310 are located on an upper surface of the buffer layer 400, and are treated by a doping process to adjust a carrier concentration, and for the doping process, reference may be made to that mentioned above. In turn, a difference in threshold voltage between the first TFT 200 and the second TFT 300 caused by a larger difference in channel width-to-length ratio is reduced. Constructions of the first TFT 200 and the second TFT 300 have been illustrated with reference to FIG. 2B, in an embodiment of the present disclosure, by way of example, without limited to those illustrated in FIG. 2B.

Figure 3:
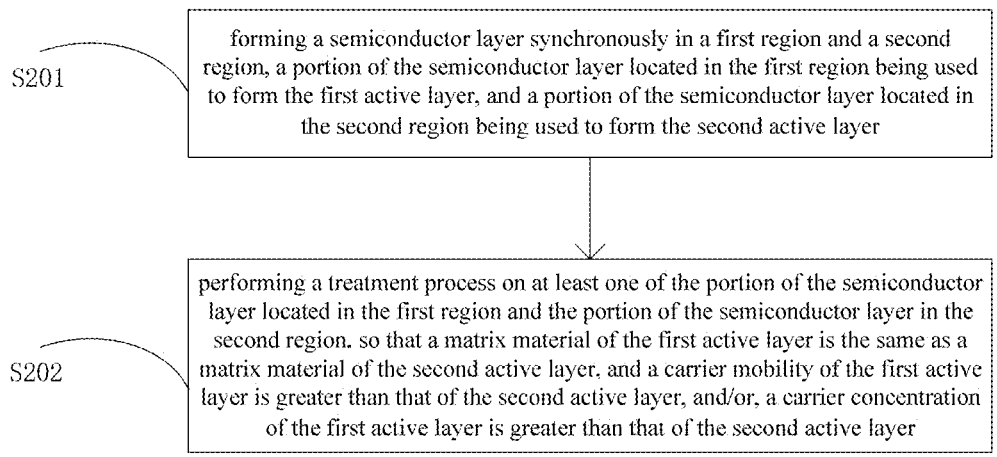
FIG. 3 is a schematic flowchart illustrating a manufacturing method provided by another embodiment of the present disclosure.

FIG. 3 is a schematic flowchart illustrating a manufacturing method provided by an embodiment of the present disclosure, and as illustrated in FIG. 3, forming the first active layer and the second active layer includes the following steps.

Step S201: forming a semiconductor layer in a first region and a second region synchronously, a portion of the semiconductor layer located in the first region being used to form the first active layer, and a portion of the semiconductor layer located in the second region being used to form the second active layer.

Step S202: performing a treatment process on at least one of the portion of the semiconductor layer located in the first region and the portion of the semiconductor layer in the second region, so that a matrix material of the first active layer is the same as a matrix material of the second active layer, and moreover, a carrier mobility of the first active layer is greater than that of the second active layer, and/or, a carrier concentration of the first active layer is greater than that of the second active layer.

For example, the above-described "forming the semiconductor layer synchronously" refers to that, in the same-step process, the semiconductor layer is formed in the first region and the second region of a base substrate at the same time, thus, a material for the portion of the semiconductor layer in the first region and a material for the portion of the semiconductor layer in the second region are the same.

For example, a material of the base substrate may be polyimide (PI), without limited thereto. For example, the base substrate may be a flexible film layer, or a rigid substrate.

For example, FIG. 4A to FIG. 4D are schematic diagrams illustrating a flow of a manufacturing method of an array substrate provided by an embodiment of the present disclosure.

Figure 4A:
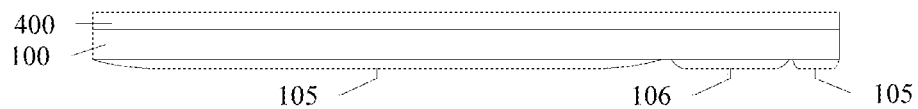
FIG. 4A to FIG. 4D are schematic diagrams illustrating a flow of a manufacturing method of an array substrate provided by another embodiment of the present disclosure.

As illustrated in FIG. 4A, forming a buffer layer 400 on a base substrate 100.

Figure 4B:
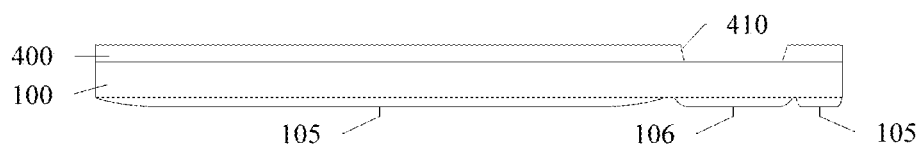

For example, as illustrated in FIG. 4B, the method includes patterning the buffer layer 400 to form a groove 410 in the second region 106. For example, an orthographic projection of the groove on the base substrate may also be located within the second region, or a part of the region outside the groove is the first region, as long as the second active layer formed subsequently is located within the groove, and the first active layer is located in a region outside the groove.

For example, the present embodiment is described with reference to the case where the groove 410 of the buffer layer 400 may expose a film layer (not illustrated) at a side of the buffer layer 400 facing the base substrate 100, by way of example, without limited thereto. For example, the groove of the buffer layer may not run through the buffer layer, either, and for example, the groove of the buffer layer may also reach into a film layer (not illustrated) at a side of the buffer layer facing the base substrate, that is, a depth of the groove is greater than a thickness of the buffer layer, and the groove is jointly formed by the buffer layer and the film layer at a side of the buffer layer facing the base substrate.

Figure 4C:
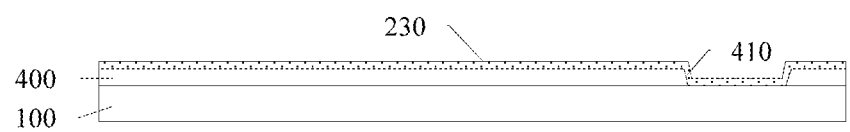
Figure 4D:
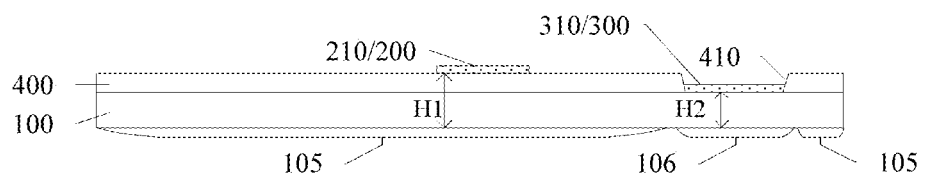

For example, as illustrated in FIG. 4C and FIG. 4D, the method includes forming a semiconductor layer 230 on the buffer layer 400 after being patterned, patterning the semiconductor layer 230 to form a first active layer 210 located in the first region 105 and a second active layer 310 located within the groove 410, and performing a chemical mechanical polishing process on the first active layer 210 located in the first region 105 to increase a carrier mobility of the first active layer 210. The first active layer 210 and the second active layer 310 in the present embodiment are formed of the same semiconductor layer 230, and in this case, a matrix material of the first active layer 210 is the same as a matrix material of the second active layer 310.

For example, a matrix material of semiconductor layer 230 is polysilicon, without limited thereto. In the present embodiment, by means of performing a chemical mechanical polishing process on the first active layer made of a polysilicon material, grain boundaries of polysilicon can be reduced to a certain extent. Thus, a mobility of carriers in polysilicon (the first active layer) is increased, and a threshold voltage of the first TFT is reduced.

For example, because the first active layer 210 in the present embodiment is formed in a region outside the groove 410 and the second active layer 310 is formed within the groove 410, a distance between the first active layer 210 and the base substrate 100 is greater than a distance between the second active layer 310 and the base substrate 100, i.e., the first active layer 210 is formed at a side of the second active layer 310 away from the base substrate 100, thereby facilitating achievement of such a case that chemical mechanical polishing is performed only on the first active layer 210 to increase a carrier mobility of the first active layer 210.

For example, in some embodiments, it is also possible that the method includes performing a chemical mechanical polishing process on a semiconductor layer 230 located in a first region 105 before patterning semiconductor layer 230, so as to increase a carrier mobility of the semiconductor layer 230 located in this region, and then performing a one-step patterning on the semiconductor layer 230 to form the first active layer 210 and the second active layer 310. Because the semiconductor layer 230 that is patterned to form the second active layer 310 is located within the groove 410, the semiconductor layer 230 located within the groove 410 will not be affected when the unpatterned semiconductor layer 230 is subjected to the chemical mechanical polishing process.

For example, the first TFT may be formed in a display region of an array substrate, and the second TFT may be formed in a peripheral region surrounding the display region. Generally, a channel width-to-length ratio of a TFT located in the peripheral region is about tens of times as much as a channel width-to-length ratio of a TFT located in the display region. In some embodiments of the present disclosure, by regulating a carrier mobility of a first active layer of a first TFT, a threshold voltage of the first TFT can be decreased to reduce a difference in threshold voltage between the first TFT and the second TFT caused by a difference in channel width-to-length ratio between the two TFTs. Thus, the difference in threshold voltage of TFTs located in the display region and the peripheral region is relatively small, so as to effectively solve a circuit failure problem in partial circuit region caused by the fact that the threshold voltage is too low or overhigh.

The method for forming the first active layer of the first TFT provided by an embodiment of the present disclosure is suitable for any TFT that needs to be regulated to decrease the threshold voltage. As long as a threshold voltage of the first TFT can be reduced by regulating a carrier mobility of the first active layer of the first TFT so as to reduce a difference in threshold voltage between the first TFT and the second TFT, the circuit can work properly owing to reduction in the difference in threshold voltage between the two TFTs, whether the second TFT is located in a display region or a peripheral region.

Figure 5:
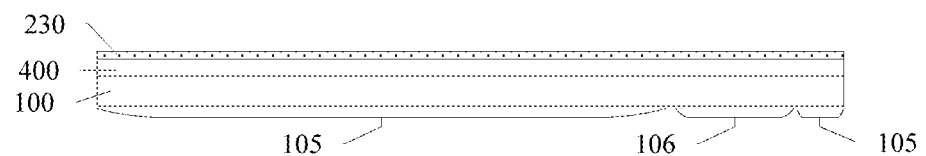
FIG. 5 is a schematic view illustrating a partial structure of an array substrate after forming a semiconductor layer provided by another embodiment of the present disclosure.

Another embodiment of the present disclosure provides a manufacturing method of an array substrate, and FIG. 5 is a schematic diagram illustrating a partial structure of an array substrate after forming the semiconductor layer according to an embodiment of the present disclosure. As illustrated in FIG. 5, it differs from the structure illustrated in FIG. 4A to FIG. 4D in that, a distance between the first active layer and the base substrate may be the same as a distance between the second active layer and the base substrate in this embodiment, that is, there is no need to form a groove in a buffer layer in the present embodiment, without limited thereto.

The treatment process on a semiconductor layer illustrated in FIG. 5 is different from that illustrated in FIG. 4A to FIG. 4D. For example, in this embodiment, the method includes: after forming the semiconductor layer on a base substrate, performing a doping process on a portion of the semiconductor layer 230 located in a first region 105 to increase a carrier concentration of the part of the semiconductor layer 230 located in the first region 105, and/or, performing a doping process on a portion of the semiconductor layer 230 located in a second region 106 to reduce a carrier concentration of the part of the semiconductor layer 230 located in the second region 106, and then, patterning the semiconductor layer 230 to form the first active layer 210 located in the first region 105 and the second active layer 310 located in the second region 106 as illustrated in FIG. 2A.

For example, a portion of the semiconductor layer 230 located in the second region 106 may be shielded with a mask, and then performing a lightly doping process on a part of the semiconductor layer 230 located in the first region 105 to increase a carrier concentration of the part of the semiconductor layer 230 located in the first region 105. With this doping process, a threshold voltage of the first TFT can be reduced, so as to reduce a difference in threshold voltage between the first TFT and the second TFT caused by a larger difference in channel width-to-length ratio.

For example, in the case where the first TFT is a P-type TFT, it is possible that a concentration of holes is increased by performing a P-type doping process on the first active layer, so as to reduce a threshold voltage of the first TFT.

For example, in the case where the first TFT is an N-type TFT, it is possible that a concentration of electrons is increased by performing an N-type doping process on the first active layer, so as to reduce a threshold voltage of the first TFT.

For example, it is also possible that a portion of the semiconductor layer 230 located in the first region 105 is shielded with a mask, and a portion of the semiconductor layer 230 (for example, the semiconductor layer is a P-type semiconductor) in the second region 106 is N-type lightly doped so as to reduce the hole concentration, and a threshold voltage of the second TFT 300 can be increased by this doping method, so as to reduce a difference in threshold voltage between the first TFT and the second TFT caused by a larger difference in channel width-to-length ratio.

The present embodiment is not limited to those described above. It is also possible that a portion of the semiconductor layer located in the first region and a portion of the semiconductor layer located in the second region are subjected to different doping processes, respectively. Thus, not only a threshold voltage of the first TFT is reduced, but also a threshold voltage of the second TFT is increased. In turn, a difference in threshold voltage between the first TFT and the second TFT caused by a larger difference in channel width-to-length ratio is reduced.

The present embodiment is not limited to those described above. It is also possible that the method includes patterning the semiconductor layer firstly to form a first active layer and a second active layer located in different regions, and then performing a doping process on the first active layer and/or the second active layer to change a threshold voltage of the first TFT and/or a threshold voltage of the second TFT. Thus, a difference in threshold voltage between the first TFT and the second TFT caused by a larger difference in channel width-to-length ratio is reduced.

In the embodiments of the present disclosure, a relevant parameter of carriers includes at least one of a carrier mobility and a carrier concentration. A carrier mobility of the first active layer being larger than that of the second active layer, and a carrier concentration of the first active layer being greater than that of the second active layer may be summarized that a relevant parameter of carriers of the first active layer is larger than a relevant parameter of carriers of the second active layer.

For example, without performing a threshold voltage adjustment process, such as CMP, and a doping process, there is a difference in threshold voltage between TFTs located in different regions, and the difference in threshold voltage of TFTs in different regions is decreased by using at least one of a CMP process and a doping process.

Another embodiment of the present disclosure provides a display device, which includes the array substrate provided by any of the above embodiments. Therefore, with the display device provided by the present embodiment, a difference in threshold voltage caused by a difference in channel width-to-length ratio of different TFTs can be compensated by adjusting a carrier mobility or a carrier concentration of TFTs in different regions. Consequently, a problem of circuit failure caused by a larger difference in threshold voltage of TFTs in different regions is solved.

For example, the display device may be a display device such as a liquid crystal device, an organic light-emitting diode (OLED) display or any product or component with display function including the display device, e.g., a TV, a digital camera, a mobile phone, a watch, a tablet PC, a notebook computer or a navigator.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The above are merely specific implementations of the present disclosure without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the appended claims.

What is claimed is:

1. An array substrate, comprising:
a base substrate;
a first thin film transistor located on the base substrate and comprising a first active layer; and
a second thin film transistor located on the base substrate and comprising a second active layer,
wherein the first active layer and the second active layer satisfy at least one of the following conditions: a carrier mobility of the first active layer is greater than that of the second active layer, and a carrier concentration of the first active layer is greater than that of the second active layer,
wherein a channel width-to-length ratio of the first thin film transistor is less than a channel width-to-length ratio of the second thin film transistor.

2. An array substrate, comprising:
a base substrate;
a first thin film transistor located on the base substrate and comprising a first active layer; and
a second thin film transistor located on the base substrate and comprising a second active layer,
wherein a matrix material of the first active layer is the same as a matrix material of the second active layer, and the first active layer and the second active layer satisfy at least one of the following conditions: a carrier mobility of the first active layer is greater than that of the second active layer, and a carrier concentration of the first active layer is greater than that of the second active layer,
wherein a channel width-to-length ratio of the first thin film transistor is less than a channel width-to-length ratio of the second thin film transistor.

3. The array substrate according to claim 1, wherein a distance between the first active layer and the base substrate is greater than a distance between the second active layer and the base substrate.

4. The array substrate according to claim 1, further comprising an insulation layer located between the base substrate and the first active layer and comprising a groove running through at least a part of the insulation layer, wherein the second active layer is located within the groove, and the first active layer is located on a surface of the insulation layer excluding the groove, and the surface is at a side of the insulation layer away from the base substrate.

5. The array substrate according to claim 1, wherein the matrix material of the first active layer and the matrix material of the second active layer comprise polysilicon.

6. An array substrate, comprising:
a base substrate;
a first thin film transistor located on the base substrate and comprising a first active layer; and
a second thin film transistor located on the base substrate and comprising a second active layer,
wherein a matrix material of the first active layer is the same as a matrix material of the second active layer, and the first active layer and the second active layer satisfy at least one of the following conditions: a carrier mobility of the first active layer is greater than that of the second active layer, and a carrier concentration of the first active layer is greater than that of the second active layer,
wherein the array substrate comprises a display region and a peripheral region surrounding the display region, the first thin film transistor is located in the display region, and the second thin film transistor is located in the peripheral region.

7. A display device comprising the array substrate according to claim 1.

8. The array substrate according to claim 2, wherein a distance between the first active layer and the base substrate is greater than a distance between the second active layer and the base substrate.

9. The array substrate according to claim 2, further comprising
an insulation layer located between the base substrate and the first active layer and comprising a groove running through at least a part of the insulation layer,
wherein the second active layer is located within the groove, and the first active layer is located on a surface of the insulation layer excluding the groove, and the surface is at a side of the insulation layer away from the base substrate.

10. The array substrate according to claim 3, further comprising
an insulation layer located between the base substrate and the first active layer and comprising a groove running through at least a part of the insulation layer,
wherein the second active layer is located within the groove, and the first active layer is located on a surface of the insulation layer excluding the groove, and the surface is at a side of the insulation layer away from the base substrate.

11. The array substrate according to claim 2, wherein the matrix material of the first active layer and the matrix material of the second active layer comprise polysilicon.

12. The array substrate according to claim 2, wherein the array substrate comprises a display region and a peripheral region surrounding the display region, the first thin film transistor is located in the display region, and the second thin film transistor is located in the peripheral region.

13. The array substrate according to claim 1, wherein the array substrate comprises a display region and a peripheral region surrounding the display region, the first thin film transistor is located in the display region, and the second thin film transistor is located in the peripheral region.

14. The array substrate according to claim 1, further comprising
an insulation layer located between the base substrate and the first active layer and comprising a groove running through at least a part of the insulation layer,
wherein the second active layer is located within the groove, and the first active layer is located on a surface of the insulation layer excluding the groove, and the surface is at a side of the insulation layer away from the base substrate,
wherein the array substrate comprises a display region and a peripheral region surrounding the display region, the first thin film transistor is located in the display region, and the second thin film transistor is located in the peripheral region.

15. The array substrate according to claim 2, further comprising
an insulation layer located between the base substrate and the first active layer and comprising a groove running through at least a part of the insulation layer,
wherein the second active layer is located within the groove, and the first active layer is located on a surface of the insulation layer excluding the groove, and the surface is at a side of the insulation layer away from the base substrate,
wherein the array substrate comprises a display region and a peripheral region surrounding the display region, the first thin film transistor is located in the display region, and the second thin film transistor is located in the peripheral region.

16. The array substrate according to claim 6, further comprising
an insulation layer located between the base substrate and the first active layer and comprising a groove running through at least a part of the insulation layer,
wherein the second active layer is located within the groove, and the first active layer is located on a surface of the insulation layer excluding the groove, and the surface is at a side of the insulation layer away from the base substrate.

17. The array substrate according to claim 6, wherein a distance between the first active layer and the base substrate is greater than a distance between the second active layer and the base substrate.

18. The array substrate according to claim 6, wherein the matrix material of the first active layer and the matrix material of the second active layer comprise polysilicon.

* * * * *